(12) United States Patent
Gao (10) Patent No.: US 11,716,835 B2
(45) Date of Patent: Aug. 1, 2023

(54) ROW BASED THERMAL MANAGEMENT SYSTEM

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 134 days.

(21) Appl. No.: 17/470,277

(22) Filed: Sep. 9, 2021

(65) Prior Publication Data
US 2023/0076991 A1    Mar. 9, 2023

(51) Int. Cl.
*H05K 7/20* (2006.01)

(52) U.S. Cl.
CPC ..... *H05K 7/20836* (2013.01); *H05K 7/20272* (2013.01); *H05K 7/20763* (2013.01)

(58) Field of Classification Search
CPC ........... H05K 7/20836; H05K 7/20272; H05K 7/20763
See application file for complete search history.

(56) References Cited

U.S. PATENT DOCUMENTS

| 6,828,675 B2 * | 12/2004 | Memory ............... F28D 7/0025 257/714 |
| 9,769,954 B2 * | 9/2017 | Bonnin .............. H05K 7/20218 |

* cited by examiner

*Primary Examiner* — Emmanuel E Duke
(74) *Attorney, Agent, or Firm* — Womble Bond Dickinson (US) LLP (57) ABSTRACT

A thermal management module includes a fluid system in fluid communication with a main cooling fluid source; a first cooling fluid manifold, and a second cooling fluid manifold. The first cooling fluid manifold is in fluid communication with the fluid system and provides a cooling fluid between the fluid system and a first server rack adjacent to the thermal management module. The second cooling fluid manifold is in fluid communication with the fluid system and provides the cooling fluid between the fluid system and a second server rack adjacent to the thermal management module. The manifold is in internal position when no rack liquid is needed adjacently, and it is extended to the adjacent rack once fluid distribution is needed from the rack.

20 Claims, 9 Drawing Sheets

ROW BASED THERMAL MANAGEMENT SYSTEM

FIELD OF THE DISCLOSURE

Embodiments of the present invention relate generally to server and electronic cooling systems. More particularly, embodiments of the invention relate to a row based thermal management system.

BACKGROUND

Electronics cooling is an important market for computing hardware and other electronic devices, such as CPU servers, GPU servers, storage servers, networking equipment, edge and mobile systems, on-vehicle computing boxes and so on. Cooling of these electronics becomes more and more challenge to ensure they function properly by constantly providing designed thermal environments. Previous solutions for cooling electronics components and implementing thermal management for processors require each server rack to be directly connected to a cooling fluid line and to include a fluid distribution system. As power densities increase, liquid cooling becomes a more feasible solution. A need, therefore, exists for a rack and server co-design for developing a reliable and efficient liquid cooling solution.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

According to previous techniques, a fluid distribution unit is added to a server rack, and the fluid distribution unit is designed as part of the rack. However, this design may lack resilience and flexibility because the rack must be designed along with the fluid distribution system and must be able to connect directly to the cooling fluid source.

Embodiments described herein provide for a row based fluid management module for server and data center fluid cooling. The fluid management module can include a fluid distribution manifold on two or more sides, as well as additional fluid distribution hardware. Fluid ports may be included in the fluid distribution manifolds, and may be manual or blind mating connectors designed to connect with servers within the rack.

The internal fluid system within the fluid management module can be designed for different functions and fluid types, in some embodiments. The module may include external ports to connect to the server rack, and internal connections. The manifolds within the fluid management module may be movable, and may be located among the rack and adjacent to the racks, enabling different fluid management designs between the data center facility and the racks.

According to some embodiments, the techniques disclosed herein provide a number of advantages, including high power density, especially different power loads for different racks. The techniques disclosed herein may also provide higher operating efficiency, flexibility to implement different fluid cooling technologies, redundant cooling design, ease of deployment, high reliability, and ease of service and maintenance. The modular design may also reduce costs for the hardware and the entire data center infrastructure. Another important feature is that the embodiments disclosed in this application may accommodate different server and rack configurations. One key challenge for fluid distribution systems in racks is location matching for fluid ports. Embodiments disclosed herein allow a user to adjust manifold height locations on the row based thermal management module. By separating the fluid systems from the rack, a rack can be manufactured and shipped without fluid components. Another benefit of some embodiments disclosed herein is that all fluid systems are integrated into the row based unit which does not impact the design, testing, transportation, or onsite deployment and commissioning of the racks.

Further benefits of the row based thermal management module include the ability to separate some fluid system functions and maintenance from the IT rack, thus improving overall system design, deployment, and operation efficiency.

Electronics cooling is an important market, since it is a fundamental technology for new chips and electronics, and it provides a basic thermal environment for proper design and operation. It is seen that thermal management is becoming more and more critical for high performance processors. As computing hardware and processors become more and more expensive, cooling reliability is critical to prevent any potential damage to expensive components.

System Overview

Figure 1:
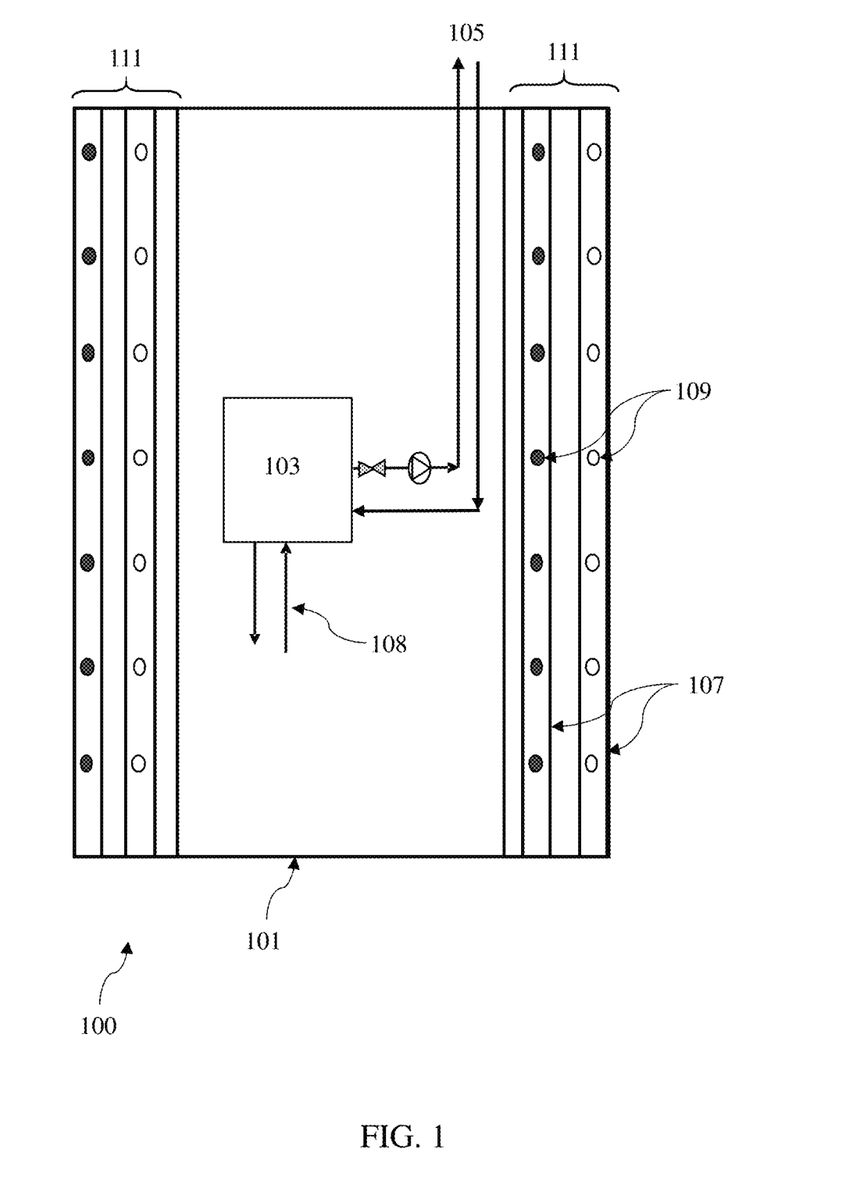
FIG. 1 is a diagram of a row based thermal management module, according to an embodiment of the present disclosure.

FIG. 1 is a diagram of a row based thermal management module 100, according to an embodiment of the present disclosure. In this embodiment, the row based thermal management module 100 includes a module housing 101, as well as an internal fluid system 103 within the thermal management module 100 and in fluid communication with a main cooling fluid source 105. The internal fluid system 103 can include a fluid pump, filtration unit, fluid valve, heat exchange unit, container, control unit, or any other appropriate hydraulic component. The internal fluid system 103 can include a liquid cooling system (i.e. a single phase system), or a two phase system.

The thermal management module 100 also includes cooling fluid manifolds that are in fluid communication with the internal fluid system 103 and can provide a cooling fluid to an adjacent server rack. In the embodiment shown in FIG. 1, the thermal management module 100 includes two cooling fluid manifolds 111, and can thus provide a cooling fluid to two different server racks located on either side of the thermal management module 100.

Each cooling fluid manifold 111 can include distribution hardware 107, such as inlet or outlet channels, as well as a number of fluid ports 109, in some embodiments. The fluid ports 109 can include blind mate connectors that are located at regular intervals and that can mate with connectors on a server rack. In some embodiments, one or both of the cooling fluid manifolds 111 can actually include more than one fluid manifold or set of channels, in order to provide different fluids to different servers within the server rack it is connected to.

In an embodiment, one or more of the cooling fluid manifolds 111 can be movable with respect to the housing 101 of the thermal management module 100. This can allow the cooling fluid manifolds 111 to be moved and attached to a rear portion of one of the adjacent server racks. The cooling fluid manifolds 111 may also be able to rotate or extend during use. In one embodiment, the cooling fluid manifolds 111 can be stored within the housing 101 when not in operation, and can rotate outward on a hinge or other rotating mechanism. Once rotated outward beyond the housing 101, the cooling fluid manifolds 111 can connect with a rack to provide cooling fluid. In another embodiment, the cooling fluid manifolds 111 can slide out of the housing 101, using a track for example. Each of the cooling fluid manifolds 111 can be different in terms of the types of connectors used, the number of connectors, and the height and location of the connectors. The internal fluid system 103 can be connected to the cooling fluid manifolds 111 using a fluid loop 108, which can include multiple loops in order to provide fluid to each cooling fluid manifold 111. In some embodiments, the fluid loop 108 can provide a different fluid to each manifold 111. In additional embodiments, more than one cooling fluid manifold 111 can be located on one or both sides of the thermal management module 100.

The thermal management module 100 can segregate the server racks from direct fluid communication with the main cooling fluid source. This eliminates the need for each rack to be directly connected to the main fluid lines, and also eliminates the need for each server rack to include its own fluid system. As will be appreciated, some detailed fluid channels and internal architecture are not shown in detail in FIG. 1, or other figures of the present application.

Figure 2:
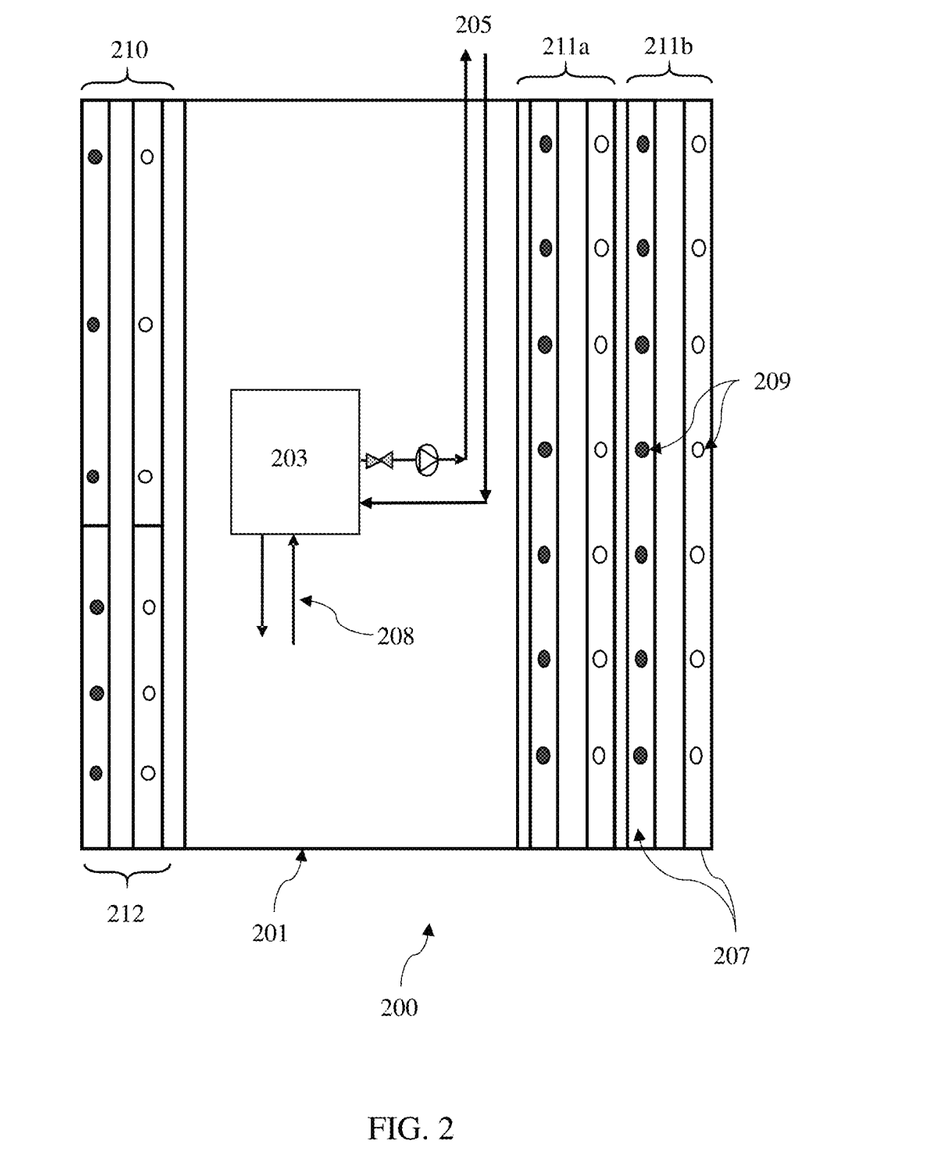
FIG. 2 is a diagram of another row based thermal management module, according to an embodiment of the present disclosure.

FIG. 2 is a diagram of another row based thermal management module 200, according to an embodiment of the present disclosure. In this embodiment, the row based thermal management module 200 includes a module housing 201, as well as an internal fluid system 203 within the thermal management module 200 and in fluid communication with a main cooling fluid source 205. The internal fluid system 203 can include a fluid pump, filtration unit, fluid valve, heat exchange unit, container, control unit, or any other appropriate hydraulic component, as well as a fluid loop 208 to provide cooling fluid to the cooling fluid manifolds 210, 212, 211a, 211b. In this embodiment, each of the cooling fluid manifolds has a fluid channel 207 and a number of fluid ports 209, but each manifold has its own size, fluid port spacing, and number of fluid ports. Specifically, in this example embodiment, cooling fluid manifold 210 is shorter than cooling fluid manifolds 211a and 211b but taller than cooling fluid manifold 212. Cooling fluid manifolds 210 and 212 each have six fluid ports, but they have a different port spacing. This allows each manifold to match with a different rack configuration. In one example embodiment, the fluid loop 208 can provide a different cooling fluid to each of the cooling fluid manifolds 210, 211a, 211b, 212. In the embodiment shown in FIG. 2, there are two sets of cooling fluid manifolds 211a and 211b designed in parallel on the right hand side of the thermal management module 200.

Figure 3A:
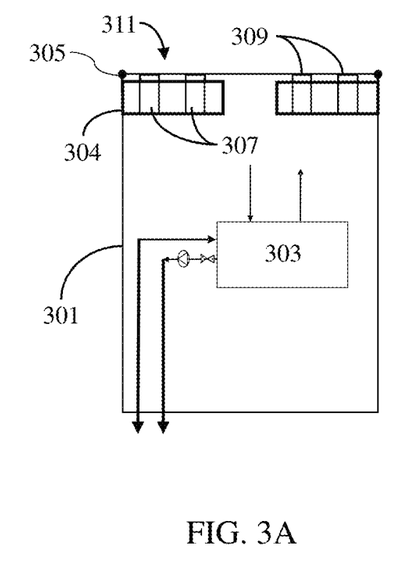
FIGS. 3A-3B show example thermal management modules with cooling fluid manifolds in different positions, according to embodiments of the present disclosure.
Figure 3B:
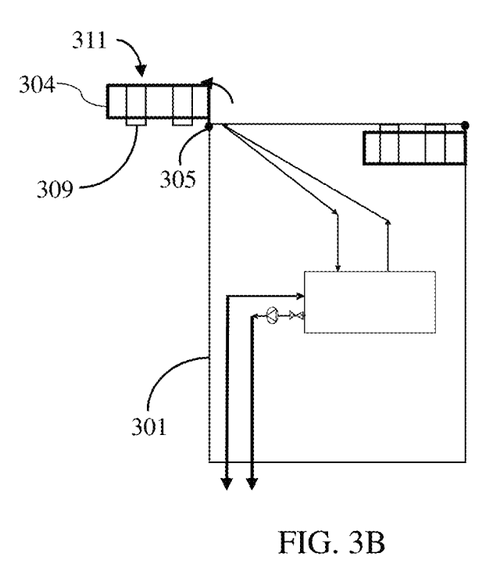

FIGS. 3A-3B show example thermal management modules with cooling fluid manifolds in different positions, according to an embodiment of the present disclosure. In the embodiment shown in FIG. 3A, both of the cooling fluid manifolds 311 are located within the module housing 301, along with the internal fluid system 303. Each of the cooling fluid manifolds 311 also includes fluid distribution hardware 307 and fluid ports 309 to connect with the fluid ports of a rack manifold, as discussed above. The thermal management module also includes a manifold connection device, such as a hinge 305 or other suitable rotating hardware, that allows the cooling fluid manifolds 311 to rotate outward to allow the fluid ports 309 to connect with a server rack. The embodiment shown in FIG. 3A may be the status when the module is not in use. In this example embodiment, the fluid ports 309 are oriented toward the back of the thermal management module, such that when rotated, they will orient forward toward the back of an adjoining rack, as shown in FIG. 3B.

In one embodiment, the fluid ports 309 or any other connectors can be fully contained within the module housing 301 when in the closed position, shown in FIG. 3A, this can ensure that the connector heads are not exposed and do not break. In such an embodiment, once the cooling fluid manifold 311 is rotated, the fluid ports 309 are exposed to the outside of the module housing 301. In some embodiments, the cooling fluid manifold 311 can be set within a frame 304, and can be adjusted horizontally within the frame in order to enable more flexible mating with the rack.

In the embodiment shown in FIG. 3B, one of the cooling fluid manifolds 312 has rotated around the hinge 305 and is now positioned outside of the module housing 301. The embodiment shown in FIG. 3B may be the status and positioning of components when the module is in use, such that the cooling fluid manifold 312 is rotated or extended to connect to a server rack.

Figure 4A:
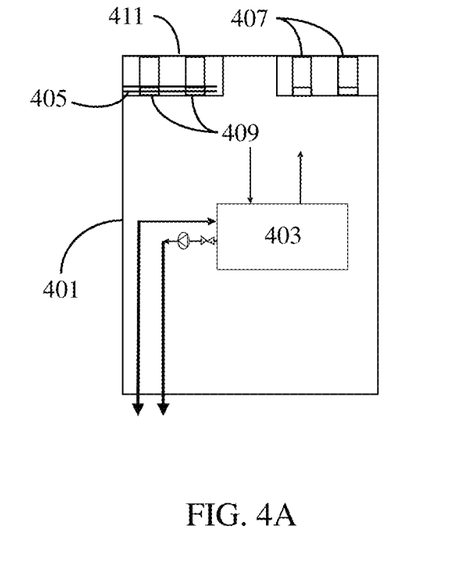
FIGS. 4A-4B show example thermal management modules with cooling fluid manifolds in different positions, according to another embodiment of the present disclosure.
Figure 4B:
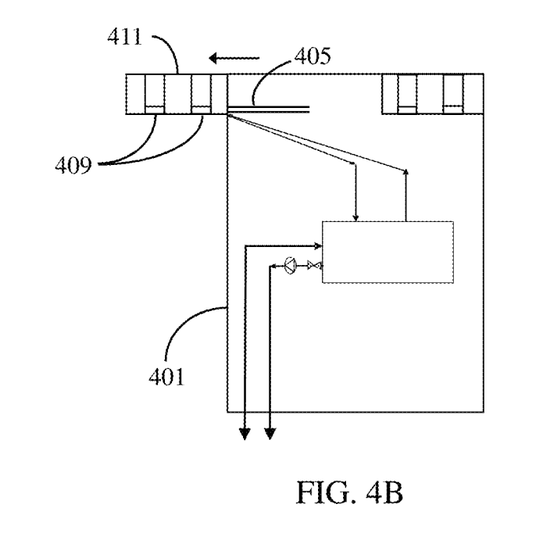

FIGS. 4A-4B show example thermal management modules with cooling fluid manifolds in different positions, according to an embodiment of the present disclosure. In the embodiment shown in FIG. 4A, both of the cooling fluid manifolds 411 are located within the module housing 401, along with the internal fluid system 403. Each of the cooling fluid manifolds 411 also includes fluid distribution hardware 407 and fluid ports 409 to connect with the fluid ports of a rack manifold, as discussed above. The thermal management module also includes a track 405, or other suitable sliding hardware, that allows the cooling fluid manifolds 411 to slide outward to allow the fluid ports 409 to connect with a server rack. The embodiment shown in FIG. 4A may be the status when the module is not in use. In this example embodiment, the fluid ports 409 are oriented toward the front of the thermal management module, such that when extended beyond the housing 401, they will orient forward toward the back of an adjoining rack, as shown in FIG. 4B. In some embodiments, the cooling fluid manifold 411 can be adjusted slightly to different horizontal locations in order to enable more flexible mating with a server rack. The cooling fluid manifold 411 can slide to the desired location and then be secured at that location, in some embodiments.

In the embodiment shown in FIG. 4B, one of the cooling fluid manifolds 412 has slid along the track 405 and is now positioned outside of the module housing 401. The embodiment shown in FIG. 4B may be the status and positioning of components when the module is in use, such that the cooling fluid manifold 412 is extended to connect to a server rack.

Figure 5:
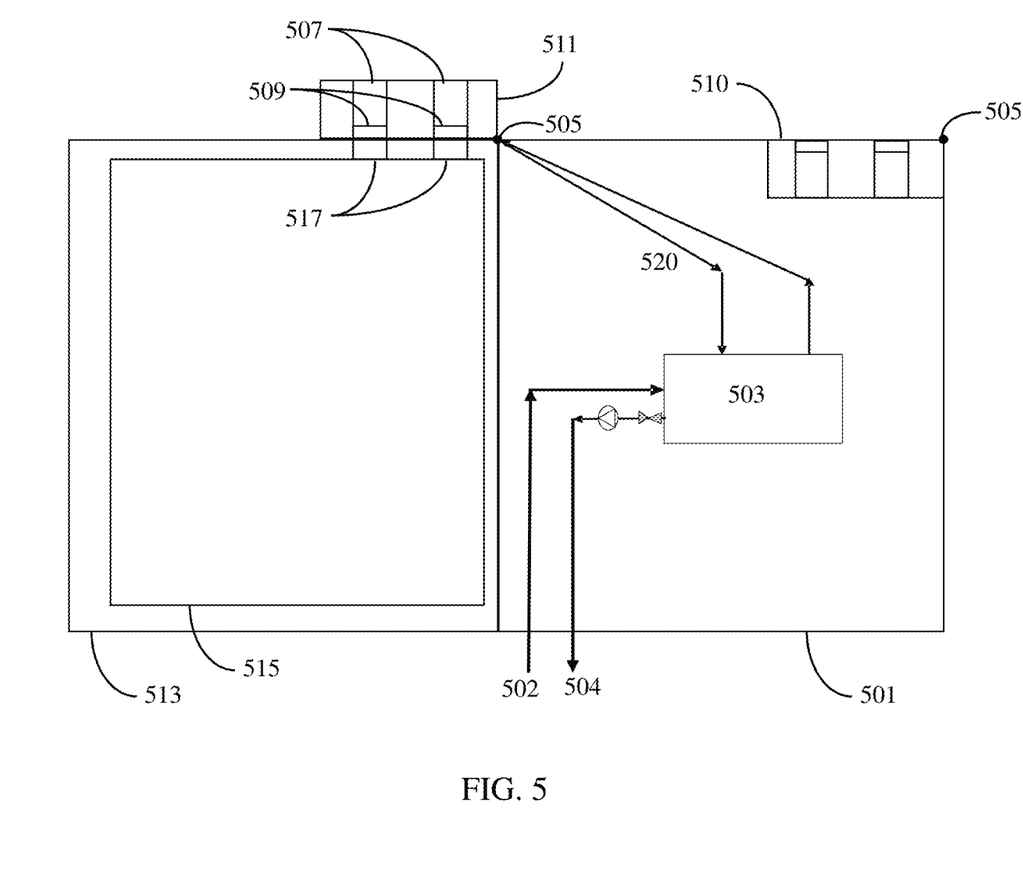
FIG. 5 is a diagram of a row based thermal management module connected to a server rack, according to an embodiment of the present disclosure.

FIG. 5 is a diagram of a row based thermal management module connected to a server rack, according to an embodiment of the present disclosure. In this embodiment, the internal fluid system 503 is located within the thermal management module housing 501, as well as one of the cooling fluid manifolds 510. The internal fluid system 503 can include a fluid pump, filtration unit, fluid valve, heat exchange unit, container, control unit, or any other appropriate hydraulic component. In some embodiments, the internal fluid system 503 can include a liquid cooling system (i.e. a single phase system), or a two phase system. The two cooling fluid manifolds 510 and 511 are each connected to the thermal management module housing via a hinge 505, which allows the manifolds to rotate outward beyond the housing to connect to the rear of a server rack 513. The two cooling fluid manifolds 510 and 511 also include fluid distribution hardware 507 and fluid ports 509, as discussed above.

In the embodiment shown in FIG. 5, the second cooling fluid manifold 511 is positioned outside the thermal management module housing 501, and the fluid distribution hardware 507 and fluid ports 509 of the manifold 511 are connected to a server 515 within a server rack 513 via fluid ports 717. In some embodiments, the fluid ports 717 can include blind mate connectors that can connect with blind mate connectors on the second cooling fluid manifold 511.

In this embodiment, the server 515 and server rack 513 are segregated or separated from the cooling fluid source, such that the server rack 513 itself does not need to connect directly to a fluid source, and does not need to include a fluid system such as the internal fluid system 503. The internal fluid system 503 can be connected to a main fluid input 502 and a fluid output 504. It should be noted that the diagram is not intended to be shown to scale, and the fluid input 502 and fluid output 504 are not necessarily connected to the front side of the thermal management module. The internal fluid system 503 can also be connected to each of the manifolds 510, 511 via a fluid loop 520, which can include a number of components and can also provide different cooling fluids to each manifold.

Figure 6:
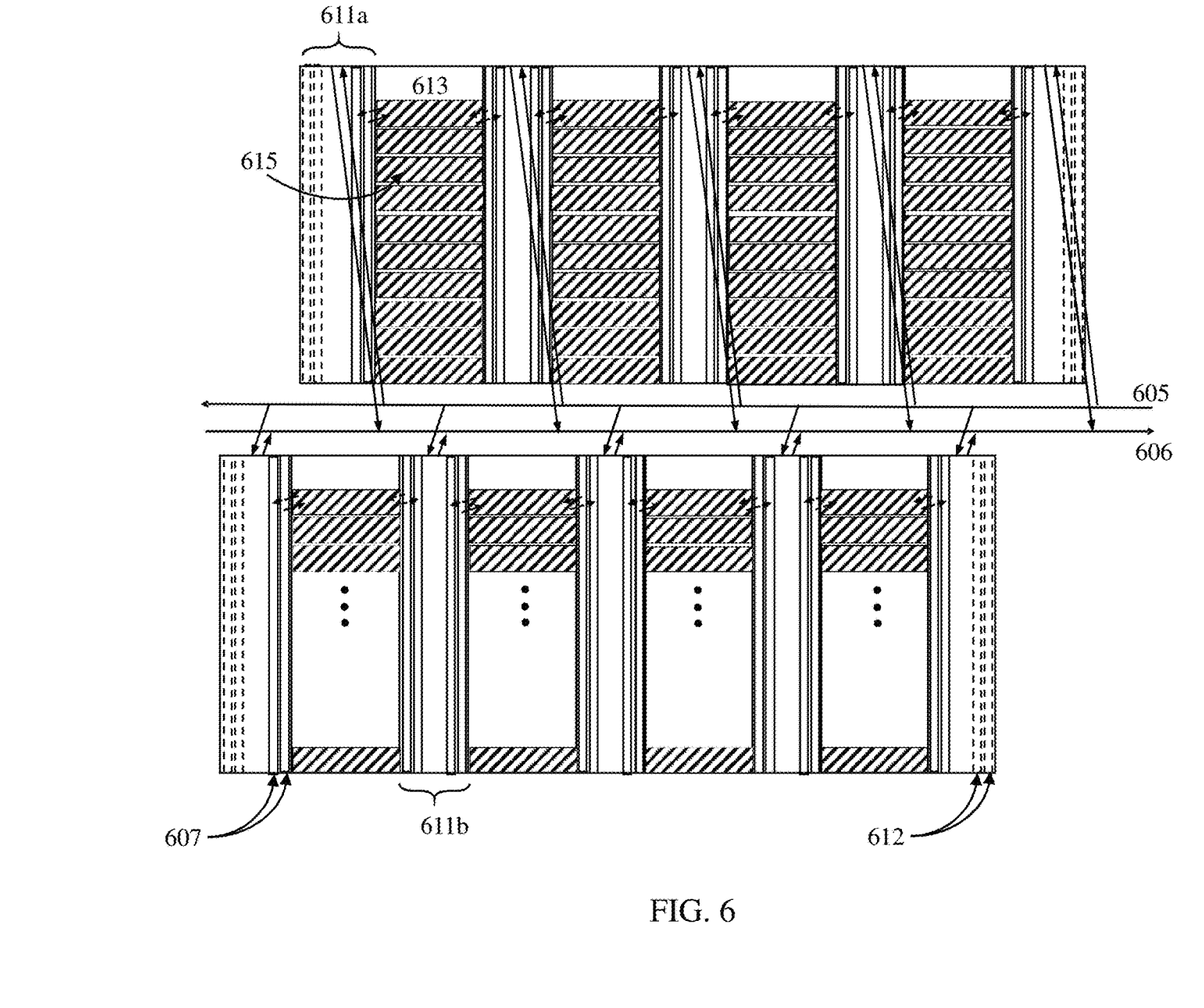
FIG. 6 is a diagram of a number of row based thermal management modules connected to a number of server racks, according to an embodiment of the present disclosure.

FIG. 6 is a diagram of a number of row based thermal management modules 611 connected to a number of server racks 613, according to an embodiment of the present disclosure. In this embodiment, a cooling fluid inlet 605 provides cooling fluid to a number of row based thermal management modules 611a, 611b, which receive the cooling fluid via the fluid distribution hardware 607, which can include manifold channels as discussed above. Each of the server racks 613 is positioned adjacent to one or more of the thermal management modules 611a, 611b, and therefore the servers 615 within the server racks 613 can receive fluid via the thermal management modules 611a, 611b. The thermal management modules are also connected to a fluid return line 606, in this embodiment. Each of the individual thermal management modules 611a, 611b can be designed according to the techniques discussed above, in some embodiments.

As discussed above, the thermal management modules 611a, 611b can be provided with cooling fluid from the cooling fluid inlet 605, and can distribute fluid to the fluid distribution hardware 607 using an internal fluid system (not shown in FIG. 6). This internal fluid system can provide fluid to the fluid distribution hardware in order to provide cooling fluid to an adjacent server rack 613. For example, the thermal management module 611a can receive cooling fluid and transmit cooling fluid to the cooling fluid inlet 605 and the fluid return line 606, and can provide fluid to the adjacent server rack 613 using the fluid distribution hardware or manifold on the right side of the thermal management module 611a. In this embodiment, the manifold on the left side of the thermal management module 611a is not provided with cooling fluid because there is not a server rack on the left side of the module 611a. In contrast, thermal management module 611b has server racks on both sides, so the manifolds on both sides of the thermal management module 611b are provided with cooling fluid from the internal fluid system within the module. In some embodiments, each of the servers 615 within each server rack 613 can be fluidly connected with one of the thermal management modules via fluid lines, shown in broken lines in FIG. 6, or alternatively using blind mate connectors as discussed above. These lines indicate the fluid streams between the servers, manifolds and thermal management modules.

In this embodiment, each thermal management module located on the end includes a manifold 612 with fluid distribution hardware that is not extended outside the module. As discussed above, when one of the manifolds is not in use and connected to a server rack, it can remain stored within the housing of the thermal management module. In the embodiment shown in FIG. 6, the stored manifolds 612 are illustrated in dashed lines as not being extended to connect with a server rack.

In this embodiment, the server racks 613 and the servers 615 within the server racks 613 are segregated from the cooling fluid inlet 605 such that the racks 613 do not need direct access to the cooling fluid inlet 605. Furthermore, the server racks 613 do not need their own fluid systems, because they can utilize the internal fluid systems located within the thermal management modules 611a, 611b, as discussed in more detail above. The internal fluid system of each of the thermal management modules 611a, 611b can include a single phase system or a two phase system, on some embodiments.

In an embodiment, because each of the server racks 613 is located adjacent to more than one of the thermal management modules, one or more of the thermal management modules can be removed from the system or disconnected without disconnecting the server racks 613 from access to the cooling fluid.

Figure 7:
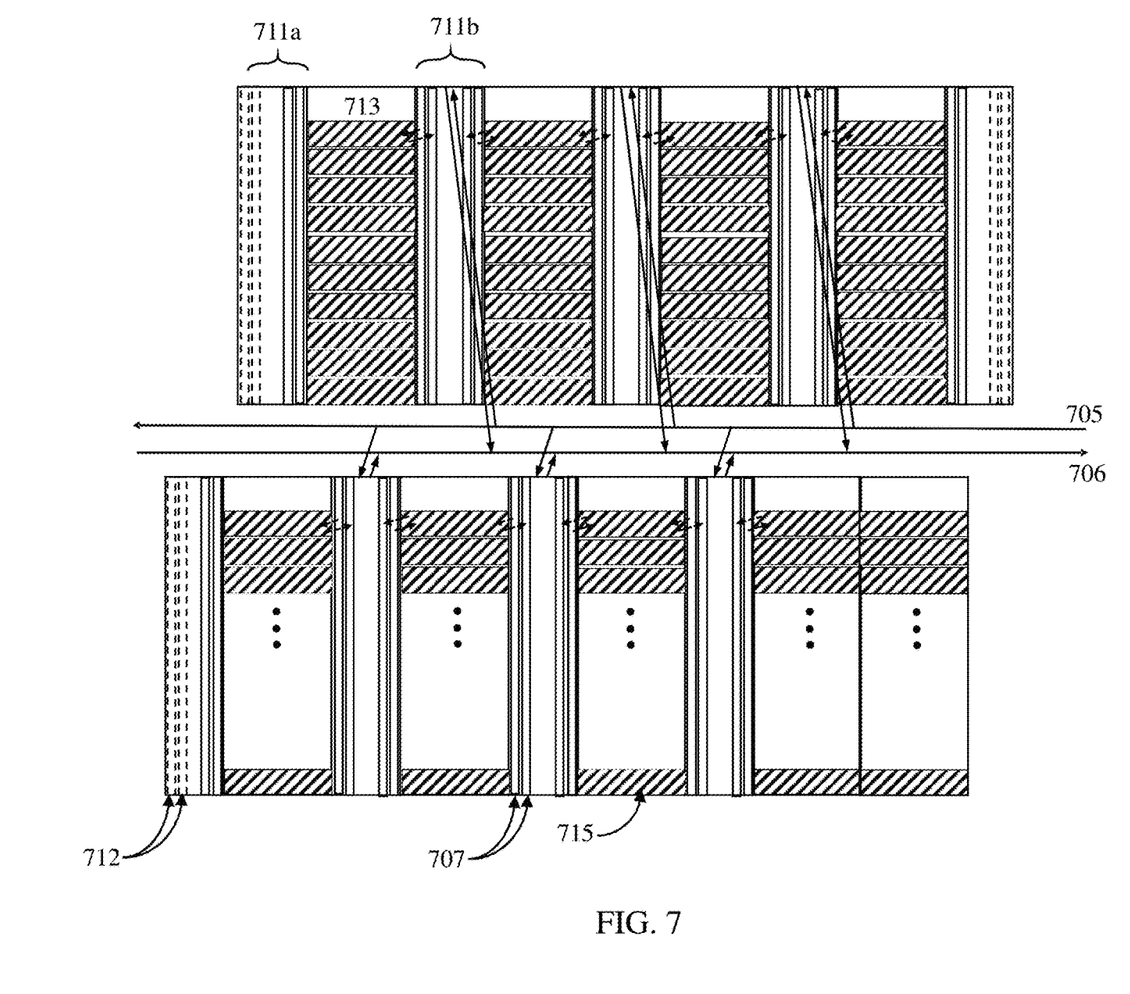
FIG. 7 is another diagram of a number of row based thermal management modules connected to a number of server racks, according to an embodiment of the present disclosure.

FIG. 7 is another diagram of a number of row based thermal management modules 711*a*, 711*b* connected to a number of server racks 713, according to an embodiment of the present disclosure. In this embodiment, not all of the thermal management modules 711*a*, 711*b* are connected to the cooling fluid inlet 705 and the fluid return line 706. Instead, only a subset of the server racks 713 require fluid distribution, so fewer than all of the thermal management modules 711*a*, 711*b* are connected to the cooling fluid inlet 705 and the fluid return line 706 based on the needs of the servers 715 within the server racks 713. In this particular embodiment, thermal management module 711*a*, as well as the other server management modules located on the ends of the diagram, are not connected to the cooling fluid inlet 705 and the fluid return line 706. This is because the server rack 713 on the top left of FIG. 7 can receive cooling fluid from the thermal management module 711*b*, as shown by the broken lines connecting the servers 715 with thermal management module 711*b*. Thus, fluid management module 711*a* does not need to be connected to the cooling fluid inlet 705 and the fluid return line 706, and can indeed be potentially removed from the system. Similar to the embodiment in FIG. 6, the thermal management modules on the ends include manifolds 712 that are not extended to connect with a server rack. These non-extended manifolds 712 are illustrated in dashed lines in FIG. 7.

Figure 8:
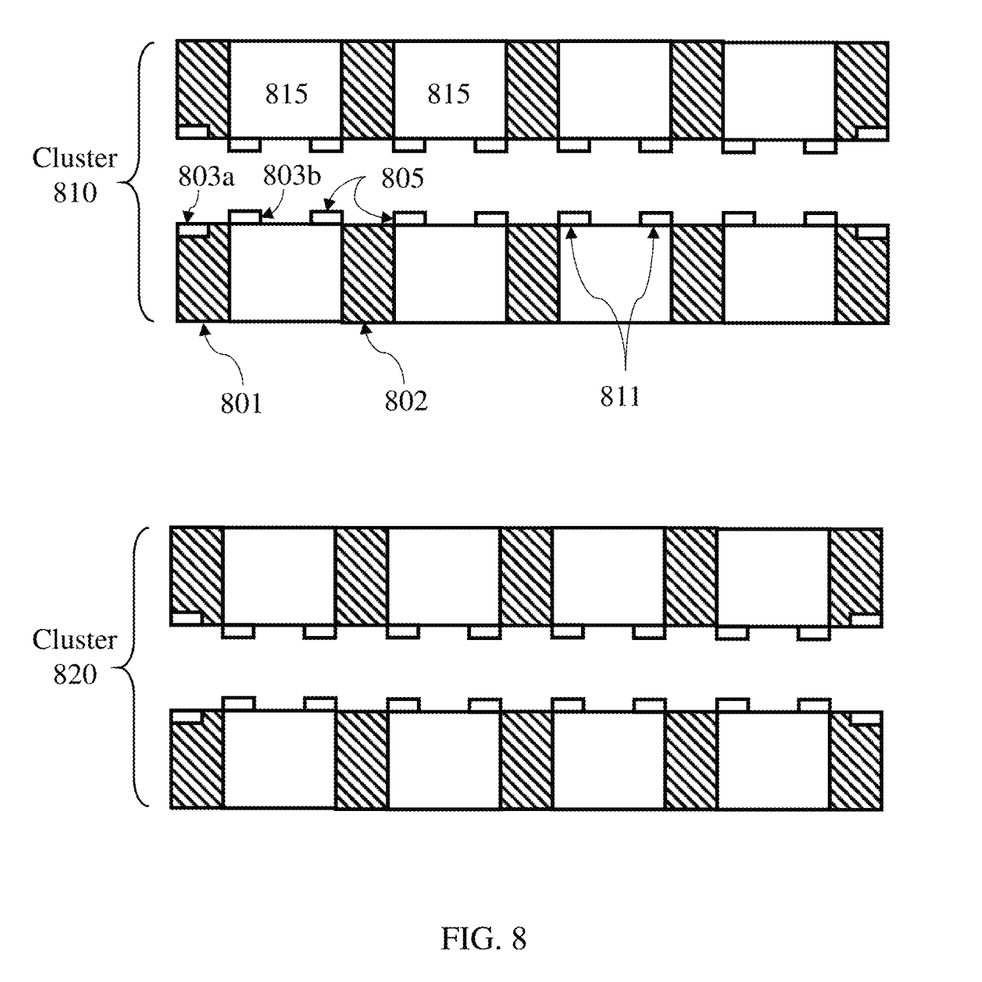
FIG. 8 is a diagram of two clusters of server racks connected to a number of row based thermal management modules, according to an embodiment of the present disclosure.

FIG. 8 is a diagram of two clusters of server racks connected to a number of row based thermal management modules, according to an embodiment of the present disclosure. In this embodiment, a top view is shown of a first cluster 810 and a second cluster 820 of server racks. Each cluster includes a number of different thermal management modules 801 adjacent to the server racks 815. Each of the thermal management modules 801 is associated with cooling fluid manifolds 811. As can be seen in this embodiment, a first thermal management module 801 includes one fluid manifold 803*b* that is not extended and is still located within the module 801. The first thermal management module 801 also includes one fluid manifold 803*a* that is extended and connected to an adjacent server rack. The first cluster 810 also includes a second thermal management module 802 where both fluid manifolds 805 are extended and connected to two adjacent server racks. In this embodiment, the server racks 815 each have at least one manifold 811 connected to a rear portion of the server rack in order to provide a fluid connection.

Figure 9:
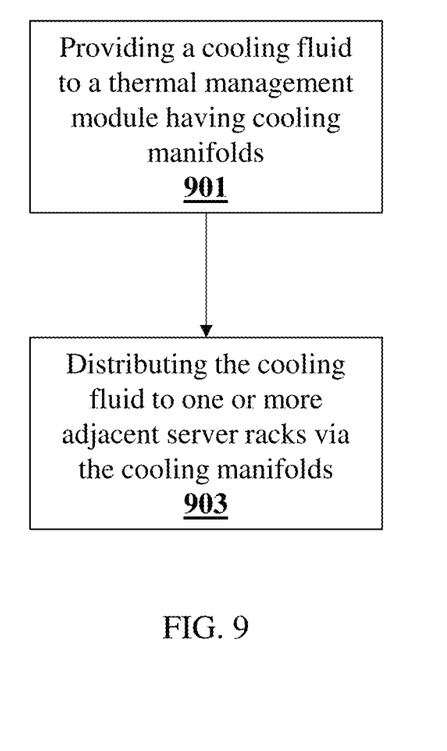
FIG. 9 is a flow chart illustrating a method of operating a server cooling system, according to embodiments of the present disclosure.

FIG. 9 is a flow chart illustrating a method of operating a server cooling system, according to embodiments of the present disclosure. At operation 901, a cooling fluid is provided to a thermal management module. The thermal management module includes an internal fluid system that is in communication with a main cooling fluid source, as well as cooling fluid manifolds.

At operation 903, the cooling fluid is distributed to adjacent server racks using the cooling fluid manifolds. In an embodiment, the thermal management module includes two cooling fluid manifolds, both in fluid communication with the internal fluid system of the thermal management module. The first cooling fluid manifold distributes fluid between the internal fluid system and a first server rack adjacent to the thermal management module, while the second cooling fluid manifold distributes fluid between the internal fluid system and a second server rack adjacent to the thermal management module.

In an embodiment, the cooling fluid manifolds can be folded within the thermal management module initially, and then rotated or extended when connecting to the server rack in order to fluidly connect with the server rack. The manifolds may be connected to the server rack using manual or blind mate connectors, in some embodiments.

According to the method disclosed in FIG. 7, the thermal management module segregates the server racks from direct fluid communication with a main cooling fluid source. The thermal management module can include a single phase cooling system or a two phase cooling system, thus providing compatibility with different cooling needs of the servers within the racks. In one embodiment, one manifold within the thermal management module can be operated with single phase fluid, while the other manifold operates with a phase change fluid.

According to one aspect of the present disclosure, a thermal management module includes an internal fluid system in fluid communication with a main cooling fluid source. The thermal management module also includes a first cooling fluid manifold and a second cooling fluid manifold. The first cooling fluid manifold is in fluid communication with the fluid system and provides a cooling fluid between the fluid system and the first server rack adjacent to the thermal management module. The second cooling fluid manifold is in fluid communication with the fluid system and provides the cooling fluid between the fluid system and a second server rack adjacent to the thermal management module. In an embodiment, the fluid system includes a fluid pump, filtration unit, fluid valve, or heat exchange unit. In an embodiment, the first cooling fluid manifold and the second cooling fluid manifold are movable with respect to a housing of the thermal management module. In an embodiment, one of the cooling fluid manifolds is configured to attach to a rear portion of the first server rack or the second server rack. In an embodiment, the thermal management module segregates the first server rack and the second server rack from direct fluid communication with the main cooling fluid source. In an embodiment, the first cooling fluid manifold and the second cooling fluid manifold include a number of blind mate connectors spaced at regular intervals. In an embodiment, the first fluid manifold and the second fluid manifold have a different height and fluid port spacing. In an embodiment, the first fluid manifold and the second fluid manifold run different cooling fluids. In an embodiment, one of the cooling fluid manifolds includes more than one fluid manifold to provide more than one fluid to different servers within the server racks.

According to another aspect of the present disclosure, a cooling system is disclosed that includes a cooling fluid inlet, a number of electronic server racks, and a number of row based thermal management modules. Each electronic server rack houses one or more servers. Each of the thermal management modules includes a fluid system, a first cooling manifold, and a second cooling manifold. The fluid system is located within the thermal management module and is in fluid communication with a cooling fluid inlet. The first and second cooling manifolds are in fluid communication with the fluid system, and provide cooling fluid to a first server rack and a second server rack that are adjacent to the thermal management module. In an embodiment, each fluid system includes a fluid pump, filtration unit, fluid valve, or heat exchange unit. In an embodiment, the row based thermal management modules segregate the electronic server racks from direct fluid communication with the cooling fluid inlet. In an embodiment, one or more of the row based thermal management modules can be removed from the cooling system without disconnecting the electronic server racks from access to the cooling fluid. In an embodiment, one of the row based thermal management modules is configured to attach to a rear portion of one of the plurality of electronic server racks. In an embodiment, the first fluid manifold and the second fluid manifold have a different height and fluid port spacing. In an embodiment, the first fluid manifold and the second fluid manifold run different cooling fluids. In an embodiment, one of the row based thermal management modules includes more than one fluid manifold providing more than one fluid to different servers within one of the plurality of electronic server racks.

According to another aspect of the present disclosure, a row based server rack cooling system is disclosed. The system includes a number of electronic server racks, each electronic server rack housing one or more servers. The system also includes a number of row based thermal management modules positioned between the electronic server racks. Each thermal management module includes a fluid system within the thermal management module and in fluid communication with a cooling fluid inlet; a first cooling fluid manifold in fluid communication with the fluid system; a second cooling fluid manifold in fluid communication with the fluid system; and a manifold connection device. The manifold connection device enables the first cooling fluid manifold and the second cooling fluid manifold to extend beyond a housing of the row based thermal management module to connect with one of the plurality of electronic server racks. In an embodiment, the manifold connection device includes a pair of hinges allowing the first cooling fluid manifold and the second cooling fluid manifold to rotate outward to connect with adjacent electronic server racks. In an embodiment, the manifold connection device includes a pair of tracks allowing the first cooling fluid manifold and the second cooling fluid manifold to slide outward to connect with adjacent electronic server racks.

One skilled in the art would recognize that various adjustments can be made to the system within the scope of this disclosure. The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A thermal management module, comprising:
   a fluid system within the thermal management module and in fluid communication with a main cooling fluid source;
   a first cooling fluid manifold in fluid communication with the fluid system and configured to provide a cooling fluid between the fluid system and a first server rack adjacent to the thermal management module; and
   a second cooling fluid manifold in fluid communication with the fluid system and configured to provide the cooling fluid between the fluid system and a second server rack adjacent to the thermal management module.

2. The thermal management module of claim 1, wherein the fluid system includes at least one of a fluid pump, filtration unit, fluid valve, and heat exchange unit.

3. The thermal management module of claim 1, wherein the first cooling fluid manifold and the second cooling fluid manifold are movable with respect to a housing of the thermal management module.

4. The thermal management module of claim 3, wherein at least one of the first cooling fluid manifold and the second cooling fluid manifold is configured to attach to a rear portion of the first server rack or the second server rack.

5. The thermal management module of claim 1, wherein the thermal management module segregates the first server rack and the second server rack from direct fluid communication with the main cooling fluid source.

6. The thermal management module of claim 1, wherein the first cooling fluid manifold and the second cooling fluid manifold include a plurality of blind mate connectors spaced at regular intervals.

7. The thermal management module of claim 1, wherein the first fluid manifold and the second fluid manifold have a different height and fluid port spacing.

8. The thermal management module of claim 1, wherein the first fluid manifold and the second fluid manifold run different cooling fluids.

9. The thermal management module of claim 1, wherein the first cooling fluid manifold or the second cooling fluid manifold includes more than one fluid manifold providing more than one fluid to different servers within the first server rack or the second server rack.

10. A cooling system, comprising:
    a cooling fluid inlet;
    a plurality of electronic server racks, each electronic server rack housing one or more servers; and
    a plurality of row based thermal management modules, each thermal management module comprising:
    a fluid system within the thermal management module and in fluid communication with a cooling fluid inlet;
    a first cooling fluid manifold in fluid communication with the fluid system and configured to provide a cooling fluid between the fluid system and a first server rack adjacent to the thermal management module; and
    a second cooling fluid manifold in fluid communication with the fluid system and configured to provide the cooling fluid between the fluid system and a second server rack adjacent to the thermal management module.

11. The cooling system of claim 10, wherein each fluid system includes at least one of a fluid pump, filtration unit, fluid valve, and heat exchange unit.

12. The cooling system of claim 10, wherein the plurality of row based thermal management modules segregate the plurality of electronic server racks from direct fluid communication with the cooling fluid inlet.

13. The cooling system of claim 10, wherein one or more of the plurality of row based thermal management modules can be removed from the cooling system without disconnecting the plurality of electronic server racks from access to the cooling fluid.

14. The cooling system of claim 10, wherein at least one of the plurality of row based thermal management modules is configured to attach to a rear portion of one of the plurality of electronic server racks.

15. The cooling system of claim 10, wherein the first fluid manifold and the second fluid manifold have a different height and fluid port spacing.

16. The cooling system of claim 10, wherein the first fluid manifold and the second fluid manifold run different cooling fluids.

17. The cooling system of claim 10, wherein at least one of the plurality of row based thermal management modules includes more than one fluid manifold providing more than one fluid to different servers within one of the plurality of electronic server racks.

18. A row based server rack cooling system, comprising:
   a plurality of electronic server racks, each electronic server rack housing one or more servers; and
   a plurality of row based thermal management modules positioned between the electronic server racks, each thermal management module comprising:
   a fluid system within the thermal management module and in fluid communication with a cooling fluid inlet;
   a first cooling fluid manifold in fluid communication with the fluid system;
   a second cooling fluid manifold in fluid communication with the fluid system; and
   a manifold connection device enabling the first cooling fluid manifold and the second cooling fluid manifold to extend beyond a housing of the row based thermal management module to connect with one of the plurality of electronic server racks.

19. The system of claim 18, wherein the manifold connection device includes a pair of hinges allowing the first cooling fluid manifold and the second cooling fluid manifold to rotate outward to connect with adjacent electronic server racks.

20. The system of claim 18, wherein the manifold connection device includes a pair of tracks allowing the first cooling fluid manifold and the second cooling fluid manifold to slide outward to connect with adjacent electronic server racks.

* * * * *